(12) United States Patent
Ullmann et al.

(10) Patent No.: US 7,589,553 B2
(45) Date of Patent: Sep. 15, 2009

(54) ELECTRONIC MODULE WITH ORGANIC LOGIC CIRCUIT ELEMENTS

(75) Inventors: Andreas Ullmann, Zirndorf (DE); Alexander Knobloch, Erlangen (DE); Merlin Welker, Baiersdorf (DE); Walter Fix, Nuremberg (DE)

(73) Assignee: PolyIC GmbH & Co. KG, Furth (DE)

( * ) Notice: Subject to any disclaimer, the term of this patent is extended or adjusted under 35 U.S.C. 154(b) by 95 days.

(21) Appl. No.: 11/817,258

(22) PCT Filed: Feb. 21, 2006

(86) PCT No.: PCT/EP2006/001523

§ 371 (c)(1),
(2), (4) Date: Oct. 15, 2007

(87) PCT Pub. No.: WO2006/092216

PCT Pub. Date: Sep. 8, 2006

(65) Prior Publication Data

US 2008/0204069 A1 Aug. 28, 2008

(30) Foreign Application Priority Data

Mar. 1, 2005 (DE) ...................... 10 2005 009 820

(51) Int. Cl.
*H03K 17/16* (2006.01)
*H03K 19/003* (2006.01)
(52) U.S. Cl. ............................ 326/28; 331/57; 257/40
(58) Field of Classification Search .................. 326/21, 326/26–28, 104–106, 108, 112, 119, 121; 331/57; 341/126, 133; 257/40
See application file for complete search history.

(56) References Cited

U.S. PATENT DOCUMENTS

| 3,512,052 A | 5/1970 | MacIver et al. |
| 3,769,096 A | 10/1973 | Ashkin |
| 3,955,098 A | 5/1976 | Kawamoto |

(Continued)

FOREIGN PATENT DOCUMENTS

DE 2102735 8/1972

(Continued)

OTHER PUBLICATIONS

U.S. Appl. No. 10/344,926, filed Feb. 12, 2004, Adolf Bernds et al.
U.S. Appl. No. 10/344,951, filed Feb. 12, 2004, Adolf Bernds et al.
U.S. Appl. No. 10/380,113, filed Sep. 25, 2003, Adolf Bernds et al.
U.S. Appl. No. 10/381,032, filed Feb. 12, 2004, Adolf Bernds et al.

(Continued)

*Primary Examiner*—Vibol Tan
*Assistant Examiner*—Jason Crawford
(74) *Attorney, Agent, or Firm*—Carella, Byrne; Elliot M. Olstein; William Squire

(57) ABSTRACT

The invention relates to an electronic module having two or more organic circuit elements connected together to give a logic circuit, said organic circuit elements being made up of organic components, in particular organic field effect transistors. The logic circuit comprises at least one filter module (5), which has an input (53) connected to one of the organic logic circuit elements, and an output (55), and is designed to filter out from the signals present at the input (53) the spurious signals generated by different signal propagation times in the organic components of the logic circuit elements, and to provide a regenerated binary signal at the output (55).

15 Claims, 6 Drawing Sheets

U.S. PATENT DOCUMENTS

| | | | |
|---|---|---|---|
| 3,999,122 A | 12/1976 | Winstel et al. | |
| 4,246,298 A | 1/1981 | Guarnery | |
| 4,302,648 A | 11/1981 | Sado et al. | |
| 4,340,057 A | 7/1982 | Bloch | |
| 4,442,019 A | 4/1984 | Marks | |
| 4,554,229 A | 11/1985 | Small | |
| 4,865,197 A | 9/1989 | Craig | |
| 4,926,052 A | 5/1990 | Hatayama | |
| 4,937,119 A | 6/1990 | Nickles et al. | |
| 5,075,816 A | 12/1991 | Stormbom | |
| 5,173,835 A | 12/1992 | Cornett et al. | |
| 5,206,525 A | 4/1993 | Yamamoto et al. | |
| 5,259,926 A | 11/1993 | Kuwabara et al. | |
| 5,321,240 A | 6/1994 | Takihira | |
| 5,347,144 A | 9/1994 | Garnier et al. | |
| 5,364,735 A | 11/1994 | Akamatsu | |
| 5,395,504 A | 3/1995 | Hoffman et al. | |
| 5,480,839 A | 1/1996 | Ezawa et al. | |
| 5,486,851 A | 1/1996 | Gehner et al. | |
| 5,502,396 A | 3/1996 | Desarzens | |
| 5,528,222 A | 6/1996 | Moskowitz | |
| 5,546,889 A | 8/1996 | Wakita et al. | |
| 5,569,879 A | 10/1996 | Gloton | |
| 5,574,291 A | 11/1996 | Dodabalapur et al. | |
| 5,578,513 A | 11/1996 | Maegawa | |
| 5,580,794 A | 12/1996 | Allen | |
| 5,625,199 A | 4/1997 | Baumbach et al. | |
| 5,629,530 A | 5/1997 | Brown et al. | |
| 5,630,986 A | 5/1997 | Charlton | |
| 5,652,645 A | 7/1997 | Jain | |
| 5,691,089 A | 11/1997 | Smayling | |
| 5,693,956 A | 12/1997 | Shi | |
| 5,705,826 A | 1/1998 | Aratani et al. | |
| 5,729,428 A | 3/1998 | Sakata et al. | |
| 5,854,139 A | 12/1998 | Kondo et al. | |
| 5,869,972 A | 2/1999 | Birch et al. | |
| 5,883,397 A | 3/1999 | Isoda et al. | |
| 5,892,244 A | 4/1999 | Tanaka et al. | |
| 5,946,551 A | 8/1999 | Dimitrakopoulos et al. | |
| 5,956,378 A * | 9/1999 | Soda | 375/376 |
| 5,967,048 A | 10/1999 | Fromson et al. | |
| 5,970,318 A | 10/1999 | Choi et al. | |
| 5,973,598 A | 10/1999 | Beigel | |
| 5,994,773 A | 11/1999 | Hirakawa | |
| 5,994,933 A * | 11/1999 | Yamanaka et al. | 327/158 |
| 5,997,817 A | 12/1999 | Crismore et al. | |
| 5,998,805 A | 12/1999 | Shi et al. | |
| 6,036,919 A | 3/2000 | Thym et al. | |
| 6,045,977 A | 4/2000 | Chandross et al. | |
| 6,060,338 A | 5/2000 | Tanaka et al. | |
| 6,072,716 A | 6/2000 | Jacobsen et al. | |
| 6,083,104 A | 7/2000 | Choi | |
| 6,087,196 A | 7/2000 | Sturm et al. | |
| 6,133,835 A | 10/2000 | DeLeeuw et al. | |
| 6,150,668 A | 11/2000 | Bao | |
| 6,180,956 B1 | 1/2001 | Chondroudis | |
| 6,197,663 B1 | 3/2001 | Chandross | |
| 6,207,472 B1 | 3/2001 | Calligari et al. | |
| 6,215,130 B1 | 4/2001 | Dodabalapur | |
| 6,221,553 B1 | 4/2001 | Wolk | |
| 6,251,513 B1 | 6/2001 | Rector | |
| 6,284,562 B1 | 9/2001 | Batlogg et al. | |
| 6,291,126 B2 | 9/2001 | Wolk et al. | |
| 6,300,141 B1 | 10/2001 | Segal et al. | |
| 6,321,571 B1 | 11/2001 | Themont et al. | |
| 6,322,736 B1 | 11/2001 | Bao | |
| 6,329,226 B1 | 12/2001 | Jones | |
| 6,330,464 B1 | 12/2001 | Colvin | |
| 6,335,539 B1 | 1/2002 | Dimitrakopoulos et al. | |
| 6,336,017 B1 | 1/2002 | Miyamoto et al. | |
| 6,340,822 B1 | 1/2002 | Brown et al. | |
| 6,342,818 B1 * | 1/2002 | Segawa et al. | 331/14 |
| 6,344,662 B1 | 2/2002 | Dimitrakopoulos et al. | |
| 6,362,509 B1 | 3/2002 | Hart | |
| 6,384,804 B1 | 5/2002 | Dodabalapur et al. | |
| 6,403,396 B1 | 6/2002 | Gudesen et al. | |
| 6,429,450 B1 | 8/2002 | Mutsaers et al. | |
| 6,498,114 B1 | 12/2002 | Amundson et al. | |
| 6,517,955 B1 | 2/2003 | Takada et al. | |
| 6,518,949 B2 | 2/2003 | Drazic | |
| 6,521,109 B1 | 2/2003 | Bartic et al. | |
| 6,548,875 B2 | 4/2003 | Nishiyama | |
| 6,555,840 B1 | 4/2003 | Hudson | |
| 6,593,690 B1 | 7/2003 | McCormick | |
| 6,603,139 B1 | 8/2003 | Tessler | |
| 6,621,098 B1 | 9/2003 | Jackson | |
| 6,852,583 B2 | 2/2005 | Bernds et al. | |
| 6,903,958 B2 | 6/2005 | Bernds et al. | |
| 6,960,489 B2 | 11/2005 | Bernds et al. | |
| 7,223,995 B2 * | 5/2007 | Fix et al. | 257/40 |
| 7,406,297 B2 * | 7/2008 | Osada | 455/75 |
| 2001/0026187 A1 | 10/2001 | Oku | |
| 2001/0046081 A1 | 11/2001 | Hayashi et al. | |
| 2001/0048341 A1 | 12/2001 | Chakravarthy | |
| 2002/0018911 A1 | 2/2002 | Bernius et al. | |
| 2002/0022284 A1 | 2/2002 | Heeger | |
| 2002/0025391 A1 | 2/2002 | Angelopoulos | |
| 2002/0053320 A1 | 5/2002 | Duthaler | |
| 2002/0056839 A1 | 5/2002 | Joo et al. | |
| 2002/0068392 A1 | 6/2002 | Lee et al. | |
| 2002/0130042 A1 | 9/2002 | Moerman et al. | |
| 2002/0170897 A1 | 11/2002 | Hall | |
| 2002/0195644 A1 | 12/2002 | Dodabalapur et al. | |
| 2003/0059987 A1 | 3/2003 | Sirringhaus et al. | |
| 2003/0070500 A1 | 4/2003 | Hung | |
| 2003/0112576 A1 | 6/2003 | Brewer et al. | |
| 2003/0141807 A1 | 7/2003 | Kawase | |
| 2003/0178620 A1 | 9/2003 | Bernds et al. | |
| 2004/0002176 A1 | 1/2004 | Xu | |
| 2004/0013982 A1 | 1/2004 | Jacobson et al. | |
| 2004/0026689 A1 | 2/2004 | Bernds et al. | |
| 2004/0084670 A1 | 5/2004 | Tripsas et al. | |
| 2004/0119504 A1 * | 6/2004 | Baude et al. | 326/104 |
| 2004/0211329 A1 | 10/2004 | Funahata et al. | |
| 2004/0233065 A1 | 11/2004 | Freeman | |
| 2004/0256467 A1 | 12/2004 | Clemens et al. | |
| 2005/0156641 A1 * | 7/2005 | Dimmler et al. | 327/156 |

FOREIGN PATENT DOCUMENTS

| | | |
|---|---|---|
| DE | 33 38 597 | 5/1985 |
| DE | 41 03 675 | 8/1992 |
| DE | 692 32 740 T2 | 4/1993 |
| DE | 42 43 832 | 6/1994 |
| DE | 43 12 766 | 10/1994 |
| DE | 196 29 291 | 1/1997 |
| DE | 195 06 907 | 9/1998 |
| DE | 198 52 312 | 5/1999 |
| DE | 198 16 860 | 11/1999 |
| DE | 199 18 193 | 11/1999 |
| DE | 198 51 703 | 5/2000 |
| DE | 100 06 257 | 9/2000 |
| DE | 199 21 024 | 11/2000 |
| DE | 199 33 757 | 1/2001 |
| DE | 695 19 782 | 1/2001 |
| DE | 199 35 527 | 2/2001 |
| DE | 199 37 262 | 3/2001 |
| DE | 100 12 204 | 9/2001 |
| DE | 100 33 112 | 1/2002 |
| DE | 201 11 825 | 2/2002 |
| DE | 100 43 204 | 4/2002 |
| DE | 100 45 192 | 4/2002 |
| DE | 100 47 171 | 4/2002 |
| DE | 100 58 559 | 5/2002 |

| | | | | | | |
|---|---|---|---|---|---|---|
| DE | 100 61 297 | 6/2002 | | JP | 08197788 | 8/1995 |
| DE | 101 17 663 | 10/2002 | | JP | 09083040 | 3/1997 |
| DE | 101 20 687 | 10/2002 | | JP | 09320760 | 12/1997 |
| DE | 101 20 686 | 11/2002 | | JP | 10026934 | 1/1998 |
| DE | 101 51 440 | 2/2003 | | JP | 2001085272 | 3/2001 |
| DE | 101 41 440 | 3/2003 | | WO | WO 93/16491 | 8/1993 |
| DE | 101 63 267 | 7/2003 | | WO | WO 94/17556 | 8/1994 |
| DE | 102 09 400 | 10/2003 | | WO | WO 95/06240 | 3/1995 |
| DE | 102 19 905 | 12/2003 | | WO | WO 95/31831 | 11/1995 |
| DE | 103 41 962 | 4/2004 | | WO | WO 96/02924 | 2/1996 |
| DE | 699 13 745 | 10/2004 | | WO | WO 96/19792 | 6/1996 |
| EP | 0 108 650 | 5/1984 | | WO | WO 97/12349 | 4/1997 |
| EP | 0 128 529 | 12/1984 | | WO | WO 97/18944 | 5/1997 |
| EP | 0 268 370 A2 | 5/1988 | | WO | WO 98/18156 | 4/1998 |
| EP | 0 268 370 A3 | 5/1988 | | WO | WO 98/18186 | 4/1998 |
| EP | 0 350 179 | 1/1990 | | WO | WO 98/40930 | 9/1998 |
| EP | 0 418 504 | 3/1991 | | WO | WO 99/07189 | 2/1999 |
| EP | 0 442 123 | 8/1991 | | WO | WO 99/10929 | 3/1999 |
| EP | 0 460 242 | 12/1991 | | WO | WO 99/10939 | 3/1999 |
| EP | 0 501 456 A2 | 9/1992 | | WO | WO 99/21233 | 4/1999 |
| EP | 0 501 456 A3 | 9/1992 | | WO | WO 99/30432 | 6/1999 |
| EP | 0 511 807 | 11/1992 | | WO | WO 99/39373 | 8/1999 |
| EP | 0 528 662 | 2/1993 | | WO | WO 99/40631 | 8/1999 |
| EP | 0 603 939 A2 | 6/1994 | | WO | WO 99/53371 | 10/1999 |
| EP | 0 615 256 | 9/1994 | | WO | WO 99/54842 | 10/1999 |
| EP | 0 685 985 | 12/1995 | | WO | WO 99/54936 | 10/1999 |
| EP | 0 716 458 A2 | 6/1996 | | WO | WO 99/66540 | 12/1999 |
| EP | 0 716 458 A3 | 6/1996 | | WO | WO 00/07151 | 2/2000 |
| EP | 0 785 578 A2 | 7/1997 | | WO | WO 00/33063 | 6/2000 |
| EP | 0 785 578 A3 | 7/1997 | | WO | WO 00/36666 | 6/2000 |
| EP | 0 786 820 | 7/1997 | | WO | WO 00/79617 | 12/2000 |
| EP | 0 690 457 | 12/1999 | | WO | WO 01/03126 | 1/2001 |
| EP | 0 962 984 A2 | 12/1999 | | WO | WO 01/06442 | 1/2001 |
| EP | 0 962 984 A3 | 12/1999 | | WO | WO 01/08241 | 2/2001 |
| EP | 0 966 182 | 12/1999 | | WO | WO 01/15233 | 3/2001 |
| EP | 0 979 715 | 2/2000 | | WO | WO 01/17029 | 3/2001 |
| EP | 0 981 165 | 2/2000 | | WO | WO 01/17041 | 3/2001 |
| EP | 0 989 614 A2 | 3/2000 | | WO | WO 01/27998 | 4/2001 |
| EP | 1 048 912 | 11/2000 | | WO | WO 01/46987 | 6/2001 |
| EP | 1 052 594 | 11/2000 | | WO | WO 01/47044 A2 | 6/2001 |
| EP | 1 065 725 A2 | 1/2001 | | WO | WO 01/47044 A3 | 6/2001 |
| EP | 1 065 725 A3 | 1/2001 | | WO | WO 01/47045 | 6/2001 |
| EP | 1 083 775 | 3/2001 | | WO | WO 01/69517 | 9/2001 |
| EP | 1 102 335 A2 | 5/2001 | | WO | WO 01/73109 A2 | 10/2001 |
| EP | 1 103 916 | 5/2001 | | WO | WO 01/73109 A3 | 10/2001 |
| EP | 1 104 035 A2 | 5/2001 | | WO | WO 02/05360 | 1/2002 |
| EP | 1 113 502 | 7/2001 | | WO | WO 02/05361 | 1/2002 |
| EP | 1 134 694 | 9/2001 | | WO | WO 02/15264 | 2/2002 |
| EP | 1 170 851 | 1/2002 | | WO | WO 02/17233 | 2/2002 |
| EP | 1 224 999 | 7/2002 | | WO | WO 02/19443 | 3/2002 |
| EP | 1 237 207 | 9/2002 | | WO | WO 02/21612 | 3/2002 |
| EP | 1251458 A2 | 10/2002 | | WO | WO 02/29912 | 4/2002 |
| EP | 1251458 A3 | 10/2002 | | WO | WO 02/43071 | 5/2002 |
| EP | 1 296 280 | 3/2003 | | WO | WO 02/47183 | 6/2002 |
| EP | 1 318 084 | 6/2003 | | WO | WO 02/065557 A1 | 8/2002 |
| FR | 2793089 | 11/2000 | | WO | WO 02/071139 | 9/2002 |
| GB | 723598 | 2/1955 | | WO | WO 02/071505 | 9/2002 |
| GB | 2 058 462 | 4/1981 | | WO | WO 02/076924 | 10/2002 |
| GR | 2001P20024 | 8/2000 | | WO | WO 02/091495 A2 | 11/2002 |
| GR | 2001P03239 | 1/2001 | | WO | WO 02/091495 A3 | 11/2002 |
| JP | 54069392 | 6/1979 | | WO | WO 02/095805 A2 | 11/2002 |
| JP | 60117769 | 6/1985 | | WO | WO 02/095805 A3 | 11/2002 |
| JP | 61001060 | 1/1986 | | WO | WO 02/099907 | 12/2002 |
| JP | 61167854 | 7/1986 | | WO | WO 02/099908 | 12/2002 |
| JP | 62065472 A | 3/1987 | | WO | WO 03/027948 | 4/2003 |
| JP | 362065477 A | 3/1987 | | WO | WO 03/036686 | 5/2003 |
| JP | 63205943 | 8/1988 | | WO | WO 03/038897 | 5/2003 |
| JP | 01169942 | 7/1989 | | WO | WO 03/046922 | 6/2003 |
| JP | 2969184 | 12/1991 | | WO | WO 03/057501 | 7/2003 |
| JP | 03290976 A | 12/1991 | | WO | WO 03/067680 | 8/2003 |
| JP | 05152560 | 6/1993 | | WO | WO 03/069552 | 8/2003 |
| JP | 05259434 | 10/1993 | | WO | WO 03/081671 | 10/2003 |
| JP | 05347422 | 12/1993 | | WO | WO 03/095175 | 11/2003 |

| WO | WO 2004/032257 | | 4/2004 |
| --- | --- | --- | --- |
| WO | WO 2004/042837 | A2 | 5/2004 |
| WO | WO 2004/042837 | A3 | 5/2004 |
| WO | WO 2004/047144 | A2 | 6/2004 |
| WO | WO 2004/047144 | A3 | 6/2004 |
| WO | WO 2004/047194 | A2 | 6/2004 |
| WO | WO 2004/047194 | A3 | 6/2004 |
| WO | WO 2004/083859 | | 9/2004 |
| WO | WO 2005/004194 | | 1/2005 |

OTHER PUBLICATIONS

U.S. Appl. No. 10/433,961, filed Apr. 1, 2004, Wolfgang Clemens et al.
U.S. Appl. No. 10/451,108, filed May 13, 2004, Mark Giles et al.
U.S. Appl. No. 10/473,050, filed May 20, 2004, Adolf Bernds et al.
U.S. Appl. No. 10/479,234, filed Dec. 30, 2004, Adolf Bernds et al.
U.S. Appl. No. 10/479,238, filed Oct. 20, 2004, Adolf Bernds et al.
U.S. Appl. No. 10/492,922, filed Mar. 3, 2005, Erwann Buillet et al.
U.S. Appl. No. 10/492,923, filed Dec. 23, 2004, Wolfgang Clemens et al.
U.S. Appl. No. 10/508,737, filed May 19, 2005, Adolf Bernds et al.
U.S. Appl. No. 10/517,750, filed Oct. 13, 2005, Wolfgang Clemens et al.
U.S. Appl. No. 10/523,216, filed Feb. 2, 2006, Adolf Bernds et al.
U.S. Appl. No. 10/523,487, filed Apr. 13, 2006, Wolfgang Clemens et al.
U.S. Appl. No. 10/524,646, filed May 11, 2006, Walter Fix et al.
U.S. Appl. No. 10/533,756, filed Jun. 8, 2006, Wolfgang Clemens et al.
U.S. Appl. No. 10/534,678, filed Jun. 8, 2006, Wolfgang Clemens et al.
U.S. Appl. No. 10/535,448, filed Jun. 8, 2006, W. Clemens et al.
U.S. Appl. No. 10/535,449, filed Feb. 16, 2006, Walter Fix et al.
U.S. Appl. No. 10/541,815, filed Jun. 8, 2006, Axel Gerlt et al.
U.S. Appl. No. 10/541,956, Wolfgang Clemens et al.
U.S. Appl. No. 10/541,957, filed Jul. 6, 2006, Walter Fix et al.
U.S. Appl. No. 10/543,561, Wolfgang Clemens et al.
U.S. Appl. No. 10/542,678, Adolf Bernds et al.
U.S. Appl. No. 10/542,679, filed Mar. 16, 2006, Adolf Bernds et al.
U.S. Appl. No. 10/562,989, Jurgen Ficker et al.
U.S. Appl. No. 10/562,869, Wolfram Glauert.
U.S. Appl. No. 10/569,763, Walter Fix et al.
U.S. Appl. No. 10/568,730, Wolfgang Clemens et al.
U.S. Appl. No. 10/569,233, Adolf Bernds et al.
U.S. Appl. No. 10/570,571, Clemens et al.
U.S. Appl. No. 10/585,775, Walter Fix et al.
U.S. Appl. No. 11/574,139, Jurgen Ficker et al.
U.S. Appl. No. 11/721,284, Markus Bohm et al.
U.S. Appl. No. 11/721,219, Wolfgang Clemens et al.
U.S. Appl. No. 11/721,244, Robert Blache et al.
U.S. Appl. No. 11/722,457, Markus Bohm et al.
U.S. Appl. No. 11/817,258, Andreas Ullmann et al.
U.S. Appl. No. 11/817,329, Andreas Ullmann et al.
Angelopoulos M et al., "In-Situ Radiation Induced Doping", Mol. Crystl. Liq. Cryst., 1990, vol. 189, pp. 221-225.
Assadi A, et al:, Field-Effect Mobility of Poly (3-Hexylthiophene) Dept. of Physics and Measurement Technology, Received Mar. 3, 1988; accepted for Publication May 17, 1988.
Bao, Z. et al., "High-Performance Plastic Transistors Fabricatecd by Printing Techniques", Chem. Mater vol. 9, No. 6, 1997, pp. 1299-1301.
Bao, Z. et al. "Organic and Polymeric Materials for the Fabrications of Thin Film Field-Effect Transistors", paper presented at the meeting of American Chemical Society, Division of Polymer Chemistry, XX, XX, vol. 39, No. 1, Mar. 29, 1998.
Baude P F et al, "Organic semiconductor RFID transponsers" International Electron Devices Meeting 2003. IEDM. Technical Digest. Washington, DC, Dec. 8-10, 2003, New York NY, IEEE, US Dec. 8, 2003, pp. 191-194.
Belloni, F. et al. "Parameters Optimization for Improved Dynamics of Voltage Multipliers for Space", 2004 35th Annual IEEE Electronics Specialists Conference, Aachen, Germany, 2004, pp. 439-442.

Bonse M. et al., "Integrated a-Si:H/Pentacene Inorganic Organic Complementary Circuits" in IEEE, IEDM 98, pp. 249-252, 1998.
Brabec, C.J. et al, "Photoinduced FT-IR spectroscopy and CW-photocurrent measurements of conjugated polymers and fullerenes blended into a conventional polymer matrix", Solar Energy Materials and Solar Cells, 2000 Elsevier Science V.V., pp. 19-33.
Brabec, C.J. et al., "Photovoltaic properties of a conjugated polymer/methanofullerene composites embedded in a polystyrene matrix", Journal of Applied Physics, vol. 85, No. 9, 1999, pp. 6866-6872.
Braun D., et al, "Visible light emission from semiconducting polymer diodes", American Institute of Physics, Applied Physics Letters 58, May 6, 1991, pp. 1982-1984.
Brown, A.R. et al., "Field-effect transistors made from solution-processed organic semiconductors", Elsevier Science, S.A., Synthetic Metals 88 (1997) pp. 37-55.
Brown, A.R., "Logic Gates Made from Polymer Transistors and Their Use in Ring Oscillators", Science, vol. 270, Nov. 10, 1995, pp. 972-974.
Chen, Shiao-Shien et al:, "Deep Submicrometer Double-Gate Fully-Depleted SOI PMOS Devices: A Concise Short-Channel Effect Threshold Voltage Model Using a Quasi-2D Approach", IEEE Transaction on Electron Devices, vol. 43, No. 9, Sep. 1996.
Chen, X.L. et al., "Morphological and Transistor Studies of Organic Molecular Semiconductors with Anisotropic Electrical Characteristics", American Chemical Society, 2001, Chem. Mater. 2001, 13, 1341-1348.
Clemens, W. et al., "Vom Organischen Transistor Zum Plastik-Chip," Physik Journal, V. 2, 2003, pp. 31-36.
Collet J. et al:, Low Voltage, 30 NM Channel Length, Organic Transistors With a Self-Assembled Monolayer as Gate Insulating Films:, Applied Physics Letters, American Institute of Physics, New York, US, Bd 76, Nr. 14, Apr. 3, 2000, Seiten 1941-1943, XP000950589, ISSN:0003-6951, das ganze Dokument.
Cox, Robert W. et al., "A Minimally Intrusive, Low Cost System for Determining Indoor Air Flow Patterns", Computers In Power Electronics, 2004. IEEE Workshop on Urbana, IL Aug. 15-18, 2004, Piscataway, NJ, IEEE, Aug. 15, 2004, pp. 63-68.
Crone, B. et al, "Large-scale complementary Integrated circuits based on Organic transistors", Nature, vol. 403, Feb. 3, 2000, pp. 521-.
Crone B. K. et al., "Design and Fabrication of Organic Complementary Circuits", J. Appl. Phys. vol. 89, May 2001, pp. 5125-5132.
Dai, L. et al, Photochemical Generation of Conducting Patterns in Polybutadiene Films:, Macromolecules, vol. 29, No. 1, 1996, pp. 282-287, XP 001042019, the whole document.
Dai, L. et al., "Conjugation of Polydienes by Oxidants Other Than Iodine", Elsevier Science S.A., Synthetic Metals 86 (1997) 1893-1894.
Dai, L. et al., "$I_2$-Doping" of 1,4-Polydienes*, Elsevier Science S.A., Synthetic Metals 69 (1995), pp. 563-566.
De Leeuw C.M. et al., "Polymeric integrated circuits and light-emitting diodes", Electron Devices Meeting, 1997. Technical Digest, International, Washington, DC, USA Dec. 7-10, 1997, New York, NY, USA, IEEE, US Dec. 7, 1997.
Dodabalapur, A. et al., Organic smart pixels, American Institute of Physics, Applied Physics Letters, vol. 73, No. 2, Jul. 13, 1998, pp. 142-144.
Drury et al., "Low-Cost All-Polymer Integrated Circuits", American Institute of Physics, Applied Physics Letters, 1998, vol. 73, No. 1, pp. 108-110, Jul. 6, 1998.
Ficker, J. et al., "Dynamic and Lifetime Measurements of Polymer OFETS and Integrated Plastic Circuits," Proc. of SPIE, v. 466, 2001, pp. 95-102.
Fix, W. et al., "Fast Polymer Integrated Circuits Based on a Polyfluorene Derivative", ESSDERC 2002, 2002, pp. 527-529.
Fix, W., et al., "Fast polymer integrated circuits", American Institute of Physics, Applied Physics Letters, vol. 81, No. 89, Aug. 2002, pp. 1735-1737.
Forrest et al.: "The Dawn of Organic Eelctronics", IEEE Spectrum, Aug. 2000, Seiten 29-34, XP002189000, IEEE Inc., New York, US ISSN:0018-9235, Seite 33, rechte Spalte, Zelle 58-Seite 34, linke Spalte, Zeile 24; Abbildung 5.

Fraunhofer Magazin—Polytronic Chips Von der Rolle, 4.2001, pp. 8-13.

Garbassi F., et al., "Bulk Modifications", Polymer Surfaces, John Wiley & Sons, 1998, pp. 289-300.

Garnier F et al:, "Vertical Devices Architecture By Molding Of Organic-Based Thin Film Transistor", Applied Physics Letters, American Institute Of Physics. XP000784120, issn: 0003-6951 abbildung 2.

Garnier, F. et al, "All-Polymer Field-Effect Transistor Realized by Printing Techniques", Science, American Association for the Advancement of Science, US, vol. 265, Sep. 16, 1994, pp. 1684-1686.

Garnier et al., "Conjugated Polymers and Oligomers as Active Material For Electronic Devices", Synthetic Metals, vol. 28, 1989.

Gelinck, G.H. et al., "High-Performance All-Polymer Integrated Circuits", Applied Physics Letters, v. 77, 2000, pp. 1487-1489.

Goncalves_Conto, Sylvie, et al., "Interface Morphology in Organic Light-Emitting Diodes", Advanced Meterials 1999, vol. 11, No. 2, pp. 112-115.

Gosain, D.P., "Excimer laser crystallized poly-Si TFT's on plastic substrates", Second International Symposium on Laser Precision Microfabrication, May 16-18, 2001, Singapore, vol. 4426, pp. 394-400.

Halls, J.J. M., et al., "Efficient photodiodes from interpenetrating polymer networks", Nature, vol. 376, Aug. 10, 1995, pp. 498-500.

Harsanyi G. et al, "Polytronics for biogtronics:unique possibilities of polymers in biosensors and BioMEMS", IEEE Polytronic 2002 Conference, Jun. 23, 2002, pp. 211-215.

Hart, C.M. et al, "Low-cost all-polymer integrated circuits", Solid-State Circuits Conference, 1998 EXXCIRC '98 Proceedings of the 24th European, The Hague, The Netherlands Sep. 22-24, 1998, Piscataway, NJ, USA, IEEE, Sep. 22, 1998, pp. 30-34.

Hebner, T.R. et al., Ink-jet printing of doped polymers for organic light emitting devices:, American Institute of Physics, Applied Physics Letters, vol. 72, No. 5, Feb. 2, 1998, pp. 519-521.

Hergel, H. J.: "Pld-Programmiertechnologien", Elektronik, Franzis Verlag GMBH. Munchen, DE, Bd 41, Nr. 5, Mar. 3, 1992, Seiten 44-46, XP000293121, ISSN: 0013-5658, Abbildungen 1-3.

Hwang J D et al:, "A Vertical Submicron Slc thin film transistor", Solid State Electronics, Elsevier Science Publishers, Barking, GB, Bd. 38, NR. 2,Feb. 1, 1995, Seiten 275-278, XP004014040, ISSN:0038-1101, Abbildung 2.

IBM Technical Disclosure Bulletin, "Short-Channel Field-Effect Transistor", IBM Corp., New York, US, Bd. 32, Nr. 3A, Aug. 1, 1989, Seiten 77-78, XP000049357, ISSN:0018-8689, das ganze Dokument.

Kawase, T., et al., "Inkjet Printed Via-Hole Interconnections and Resistors for All-Polymer Transistor Circuits", Advanced Materials 2001, 13, No. 21, Nov. 2, 2001, pp. 1601-1605.

Kind, D., "Einfuhrung in die Hochspannungs-Versuchstechnik", Friedrich. Vieweg & Sohn, Braunschweig/Wiesbaden, pp. 16-21.

Klauk, H. et al., "Fast Organic Thin Film Transistor Circuits", IEEE Electron Device Letters, vol. 20, No. 6, pp. 289-291.

Klauk, H. et al., "Pentacene Thin Film Transistors and Inverter Circuits", 1997 International Electron Devices Meeting Technical Digest, pp. 539-542, Dec. 1997.

Knobloch, A. et al., "Printed Polymer Transistors", Proc. Polytronic, v. 84, 2001, pp. 84-89.

Kobel W. et al., "Generation of Micropatterns in Poly (3-Methyl-Thiophene) Films Using Microlithography: A First Step in the Design of an All-Organic Thin-Film Transistor" Synthetic Metals, V. 22, 1988, pp. 265-271.

Koezuka, H. et al., "Macromolecular Electronic Device", Mol. Cryst. Liq. Cryst. 1994, vol 2555, pp. 221-230.

Kuhlmann et al., "Terabytes in Plastikfolie", Organische Massenspeicher vor der Serienproduktion.

Kumar, Anish et al:, "Kink-Free Polycrystalline Silicon Double-Gate Elevated-Channel Thin-Film Transistors", IEEE Transactions on Electron Devices, vol. 45, No. 12, Dec. 1998.

Lidzey, D. G. et al., "Photoprocessed and Micropatterned Conjugated Polymer LEDs", Synthetic Metals, V. 82, 1996, pp. 141-148.

Lowe, J. et al., "Poly (3—(2—Acetoxyethyl)Thiophene): A Model Polymer for Acid-Catalyzed Lithography", Synthetic Metals, Elsevier Sequoia, Lausanne, CH, Bd, 85, 1997, Seiten 1427-1430.

Lu, Wen et al., "Use of Ionic Liquids for π-Conjugated Polymer Electrochemical Devices", Science, vol. 297, 2002, pp. 983-987/.

Lucent Technologies, "Innovation marks significant milestone in the development of electronic paper", Cambridge, MA and Murray Hill, NJ, Nov. 20, 2000. XP-002209726.

Manuelli, Alessandro et al., "Applicability of Coating Techniques for the Production of Organic Field Effect Transistors", IEEE Polytronic 2002 Conference, 2002, pp. 201-204.

Marko, H., Vorlesungsmanuskript "Nachrichtentechnik 2 (Modulationsverfahren" des Lehrstuhls fur Nachirichtentechnik der Technischen Universitat Munchen, 1989.

Miyamoto, Shoichi et al:, Effect of LDD Structure and Channel Poly-Si Thinning on a Gate-All-Around TFT (GAT) for SRAM's, IEEE Transactions on Electron Devices. vol. 46, No. 8, Aug. 1999.

Nalwa, H.S., "Organic Conductive Molecules and Polymers", vol. 2, 1997, pp. 534-535.

"Nachrichtentechnik 2 (Modulationsverfahren)" des Lehrstuhls fur Nachrichtentechnik der Technischen Universitat Munchen, 1989.

Oelkrug, D. et al., "Electronic spectra of self-organized oligothiophene films with 'standing' and 'lying' molecular units", Elsevier Science S.A., 1996, Thin Solid Films 284-270.

Qiao, X. et al., "The FeCl3-doped poly3-alkithiophenes) in solid state", Elsevier Science, Synthetic Metals 122 (2001) pp. 449-454.

Redecker, M. et al., "Mobility enhancement through homogeneous nematic alignment of a liquid-crystalline polyfluorene", 1999 American Institute of Physics, Applied Physics Letters, vol. 74, No. 10, pp. 1400-1402.

Rogers J A et al:, "Low-Voltage 0.1 Mum Organic Transistors and Complementary Inverter Circuits Fabricated with a Low-Cost Form of Near-Field Photolithography", Applied Physics Letters, American Institute of Physics. New York, US, Bd. 75, Nr. 7, Aug. 16, 1999, Seiten 1010-1012, XP000934355, ISSN: 003-6951, das ganze Dokument.

Rogers, J. A. et al:, "Printing Process Suitable for Reel-to-Reel Production of High-Performance Organic Transistors and Circuits", Advanced Materials, VCH, Verlagsgesellschaft, Weinheim, DE, Bd. 11, Nr. 9, Jul. 5, 1999, Seiten 741-745, P000851834, ISSN: 0935-9648, das ganze Dokument.

Roman et al., "Polymer Diodes With High Rectification", Applied Physics Letters, vol. 75, No. 21, Nov. 22, 1999.

Rost, Henning et al., "All-Polymer Organic Field Effect Transistors", Proc. Mat. Week, CD, 2001, pp. 1-6.

Sandberg, H. et al, "Ultra-thin Organic Films for Field Effect Transistors", SPIE vol. 4466, 2001, pp. 35-43.

Schoebel, "Frequency Conversion with Organic-On-Inorganic Heterostructured Diodes", Extended Abstracts of the International Conference on Solid State Devices and Materials, Sep. 1, 1997.

Schrodner M. et al., "Plastic electronics based on Semiconducting Polymers", First International IEEE Conference on Polymers and Adhesives in Microelectronics and Photonics. Incorporating Poly, Pep & Adhesives in Electronics. Proceedings (Cat. No. 01TH8592), First International IEEE Conference on Polymers and Adhesives in Micr, Seiten 91-94, Oct. 21, 2001-Oct. 24, 2001.

Shaheen, S.E., et al., "Low band-gap polymeric photovoltaic devices", Synthetic Metals, vol. 121, 2001, pp. 1583-1584.

Speakman, S.P. et al., High performance organic semiconducting thin films: Ink Jet printed polythophene [π-P3HT], Organic Electronics 2 (2), 2001, pp. 65-73.

Takashima, W. et al., Electroplasticity Memory Devices Using Conducting Polymers and Solid Polymer Electrolytes, Polymer International, Melbourne, 1992, pp. 249-253.

Ullman, A. et al., "High Performance Organic Field-Effect Transistors and Integrated Inverters", Mat. Res. Soc. Symp. Proc., v. 665, 2001, pp. 265-270.

Velu, G. et al. "Low Driving Voltages and Memory Effect in Organic Thin-Film Transistors With A Ferroelectric Gate Insulator", Applied Physics Letters, American Institute of Physics, New York, vol. 79, No. 5, 2001, pp. 659-661.

Wang, Hsing et al., "Conducting Polymer Blends: Polythiophene and Polypyrrole Blends with Polystyrene and Poly(bisphenol A carbonate)", Macromolecules, 1990, vol. 23, pp. 1053-1059.

Wang, Yading et al., "Electrically Conductive Semiinterpenetrating Polymer Networks of Poly(3-octylthiophene)", Macromolecules 1992, vol. 25, pp. 3284-3290.

Yu, G. et al., "Dual-function semiconducting polymer devices: Light-emitting and photodetecting diodes", American Institute of Physics, Applied Physics Letter 64, Mar. 21, 1994, pp. 1540-1542.

Zangara L., "Metall Statt Halbleiter, Programmierung Von Embedded ROMS Ueber Die Metallisierungen", Elektronik, Franzis Verlag GmbH, Munchen, DE, vol. 47, No. 16, Aug. 4, 1998, pp. 52-55.

Zheng, Xiang-Yang et al., "Electrochemical Patterning of the Surface of Insulators with Electrically Conductive Polymers", J. Electrochem. Soc., v. 142, 1995, pp. L226-L227.

Zie Voor Titel Boek, d 2e Pagina,XP-002189001, p. 196-228.

Office Action, DE, Feb. 9, 2006, German Patent Office.

Baude P. F. et al, "Pentacene based RFID transponder circuitry", Jun. 21, 2004, Device Research Conference, 2004. 62nd Drc. Conference Digest, Notre Dame, IN, USA Jun. 21-23, 2004, Piscataway, NJ, USA, IEEE, pp. 227-228.

Mukherjee, S., et al, "Layout-level synthesis of RF bandpass filter on organic substrates for wi-fi applications", Oct. 11, 2004, Microwave Conference, 2004. 34th European Amsterdam The Netherlands, Oct. 13, 2004, Piscataway, NJ, jUSA, IEEE pp. 13777-1380.

* cited by examiner

Timing Diagram

Filter Module 23 Circuit

Timing Diagram

ELECTRONIC MODULE WITH ORGANIC LOGIC CIRCUIT ELEMENTS

This application is a 371 of PCT EP06/001523 filed on Feb. 21, 2006.

The invention relates to an electronic module having two or more logic circuit elements connected together to give a logic circuit, said logic circuit elements being made up of organic components, in particular organic field effect transistors.

Logic circuit elements such as NAND-gates, NOR-gates or inverters are elementary components of a digital electronic circuit. The switching speed of the logic circuit elements making up the digital electronic circuit largely determines the switching speed of the digital circuit.

In conventional silicon semiconductor technology, logic gates are implemented using n-type and p-type transistors, enabling extremely high switching speeds to be achieved for the gates.

It is also known to construct logic gates from organic components. In this case, a traditional resistor is normally used in place of the n-type transistor, and the p-type transistors are substituted by organic field effect transistors. The disadvantage with these logic gates using organic field effect transistors is that they either switch over slowly (when the charge-transfer currents are very different, i.e. the integrals under the current-voltage curve differ widely) or they cannot be switched off (when the difference in voltage in the current-voltage diagram is too small).

In order to increase the switching speed of digital circuits manufactured in organic semiconductor technology, WO 2003/081 671 A3 proposes to replace the resistor in logic gates with a second organic field effect transistor that is used as a resistor. To do this, organic field effect transistors are used that have an extremely thin organic semiconductor layer (approximately 5 to 30 nm), or in which the conductivity of the organic semiconductor layer has been reduced by selective treatment (e.g. by hydrazine treatment and/or selective oxidization) to such an extent that the OFF currents are only approximately one order of magnitude lower than the ON currents.

The object of the invention is thus to increase further the processing speed that can be achieved by a digital circuit made up of organic components.

This object is achieved by an electronic module having two or more organic logic circuit elements connected together to give a logic circuit, said logic circuit elements being made up of organic components, in which the logic circuit comprises at least one filter module, which has an input connected to one of the organic logic circuit elements, and an output, and which filters out from the signal present at the input the spurious signals generated by different signal propagation times in the organic components of the logic circuit elements, and provides a regenerated binary signal at the output.

Owing to the low charge carrier mobility of organic semiconductors available today, and because of the different operating principle of organic field effect transistors, the switching speeds that can be achieved by digital circuits made up of organic components are orders of magnitude lower than those made in silicon technology.

The invention is based on the knowledge that synchronization problems occur when increasing the clock rate in more complex organic circuits in which different signals are combined that have been processed by different numbers of organic components. The edges of one signal are delayed compared to another, which means that when these signals are combined, short spurious noise signals appear in the combined output signal. These noise spikes cause significant problems in the further processing of the signal, because these errors then continue to accumulate and consequently are interpreted incorrectly as part of the wanted signal. This spurious noise is removed by the filter module described above. This makes it possible to operate the digital circuit at a higher clock rate and hence to increase the speed of data processing.

Advantageous embodiments of the invention are described in the subclaims.

Organic logic gates such as AND-gates, OR gates, NAND gates, NOR-gates or inverters, or even more complex organic logic circuit elements such as shift registers or adders, can be used, for example, as organic logic circuit elements connected together to give the logic circuit. Depending on the complexity of the logic circuit, one or more filter modules are incorporated in the logic circuit, where increasing the number of filter modules used normally makes it possible to increase the processing speed of the digital circuit. The filter modules can be connected here between two organic logic circuit elements, so that both the input of the filter module and the output of the filter module are connected to a logic circuit element. It is also possible, however, to arrange the filter module at an output of the logic circuit, so that only the input of the filter module is connected to a logic circuit element of the logic circuit, and the output of the filter module is connected to an output of the logic circuit.

The filter module is preferably connected to the output of an organic logic circuit element that combines by a logic operation a plurality of binary input signals generated via different branches of the logic circuit to produce an output signal.

According to a preferred exemplary embodiment of the invention, the filter module comprises a low-pass filter and a subsequent discretization amplifier circuit. The low-pass filter is designed here to filter out the noise spikes generated by different signal propagation times in the organic components of the preceding logic circuit elements. The cut-off frequency of the low-pass filter is selected so as to attenuate the amplitude of the noise spikes between 50 and 70%, for example. The noise spikes are thus eliminated by the subsequent discretization amplifier circuit. In addition, the edge delay of a subsequent H-level (H=High) of the wanted signal is thereby kept to a minimum.

The low-pass filter is preferably designed as an RC low-pass filter and can hence be implemented cheaply in an integrated circuit.

The filter module is made up of organic components. The filter module here preferably comprises a resistor and a discretization amplifier circuit made up of organic components. The RC low-pass filter is formed by the resistor and the input capacitance of the amplifier circuit. In a particularly low-cost design of the filter module, the resistor and the gate-source capacitance of the first organic field effect transistor of the amplifier circuit form the RC low-pass filter in this case. These two components are selected so as to produce an RC low-pass filter having a cut-off frequency that is suitable for filtering out the noise spikes produced by the different signal propagation times in the organic components of the preceding logic circuit elements. The cut-off frequency of the low-pass filter must hence be selected according to the noise spikes produced by the different signal propagation times in the organic components of the logic circuit elements. These noise spikes depend not only on the preceding logic circuit elements and the connection of these logic circuit elements, but also on the clock frequency used to operate the logic circuit, and can be determined by measurement or simulation, for example.

Such a filter module can be implemented using a small number of components, and hence can be integrated in a logic circuit at low cost.

According to another preferred exemplary embodiment of the invention, the filter module is made up of a plurality of organic components, which are connected together so that the filter module only transfers the level of the signal present at the input to the output at specific points in time set by a separate clock signal, and for the rest of the time retains the last previous level at the output. The clock signal is thereby phase-shifted with respect to the clock of the wanted signal present at the input of the filter module. The phase shift is selected here so that there is no possibility of a spurious signal appearing at the input of the filter module at the time of the transfer, and hence the filter module transfers a correct signal level. This signal level is then retained by the filter module for the rest of the clock period, so that a signal without noise spikes is produced at the output.

Good results can be achieved by the separate clock signal being phase-shifted with respect to the clock of the signal present at the input by between 90 and 270°, preferably by about 180°. According to a further exemplary embodiment of the invention, the phase shift is selected so that the glitches produced by different signal propagation times in the organic components of the preceding logic circuit elements lie at least 0.2 period lengths away from the time of the transfer. To do this, it is necessary to determine the phase relation of the glitches by measurement or simulation, and to select a phase shift of the separate clock signal that is appropriate to this relationship.

The separate clock signal for the filter module is preferably provided by a ring oscillator made up of organic field effect transistors. The separate clock signal is preferably provided in this case by the ring oscillator that generates the clock signal for the logic circuit.

In this case, the clock signal generated by the ring oscillator can be supplied to the filter module via one or more series-connected delay elements in order to achieve thereby the required phase relationship between the separate clock signal and the wanted signal at the input of the filter module (normally, because of the signal propagation times, this does not equal the phase of the clock signal generated by the ring oscillator for the logic circuit).

The component costs can be reduced further by, in the ring oscillator, which comprises a plurality of organic circuit elements chained together in a ring one after another, the clock signal for the logic circuit being taken from a first output of a first circuit element, and a separate clock signal for the filter module being taken from an output of a second circuit element after the first circuit element. By this means, it is even possible to supply two or more filter modules with mutually phase-shifted and respectively appropriate separate clock signals for very low component costs.

The electronic module according to the invention can be used for a multiplicity of applications. One application to be given specific mention here is the use of the electronic module according to the invention as an RFID transponder or as a security element, in particular to protect important documents and goods. In this case, the electronic module according to the invention is preferably in the form of a flexible foil element, which is connected by an adhesive layer to the object to be protected, for example important paperwork such as a passport or a banknote.

The invention is described below with reference to a number of exemplary embodiments using the enclosed drawings by way of example.

FIG. 1 shows an electronic module 10 made of a flexible, multilayer foil body containing one or more electrical functional layers.

The electrical functional layers of the foil body comprise (organically) conducting layers, organically semi-conducting layers and/or organic insulating layers, which are arranged one on top of the other in at least partially patterned form. In addition to these electrical functional layers, the multilayer foil body optionally also includes one or more substrate layers, protective layers, decorative coatings, bonding layers or adhesive layers. The electrically conducting functional layers are made of a conductive patterned metallization, preferably of gold or silver. It can also be provided, however, to form this functional layer from an inorganic electrically conducting material, for example indium tin oxide or a conducting polymer such as polyaniline or polypyrol. The organically semi-conducting functional layer is made of conjugated polymers, for example, such as polythiophenes, polyphenylvinylenes or polyfluorene derivatives, which are applied as a solution by spin-coating, blade-coating or screen-printing. "Small molecules", i.e. oligomers such as sexithiophenes or pentacenes, applied by vacuum deposition are also suitable as an organic semiconductor layer. These organic layers are preferably applied fully or partially pre-patterned by a printing technique (gravure printing, screen printing, pad printing). For this purpose, the organic materials provided for the layers are formed as soluble polymers, where the term polymer in this case also includes oligomers and "small molecules", as already described above.

The electrical functional layers of the foil body are designed here to implement the electrical circuits explained below.

Figure 1:
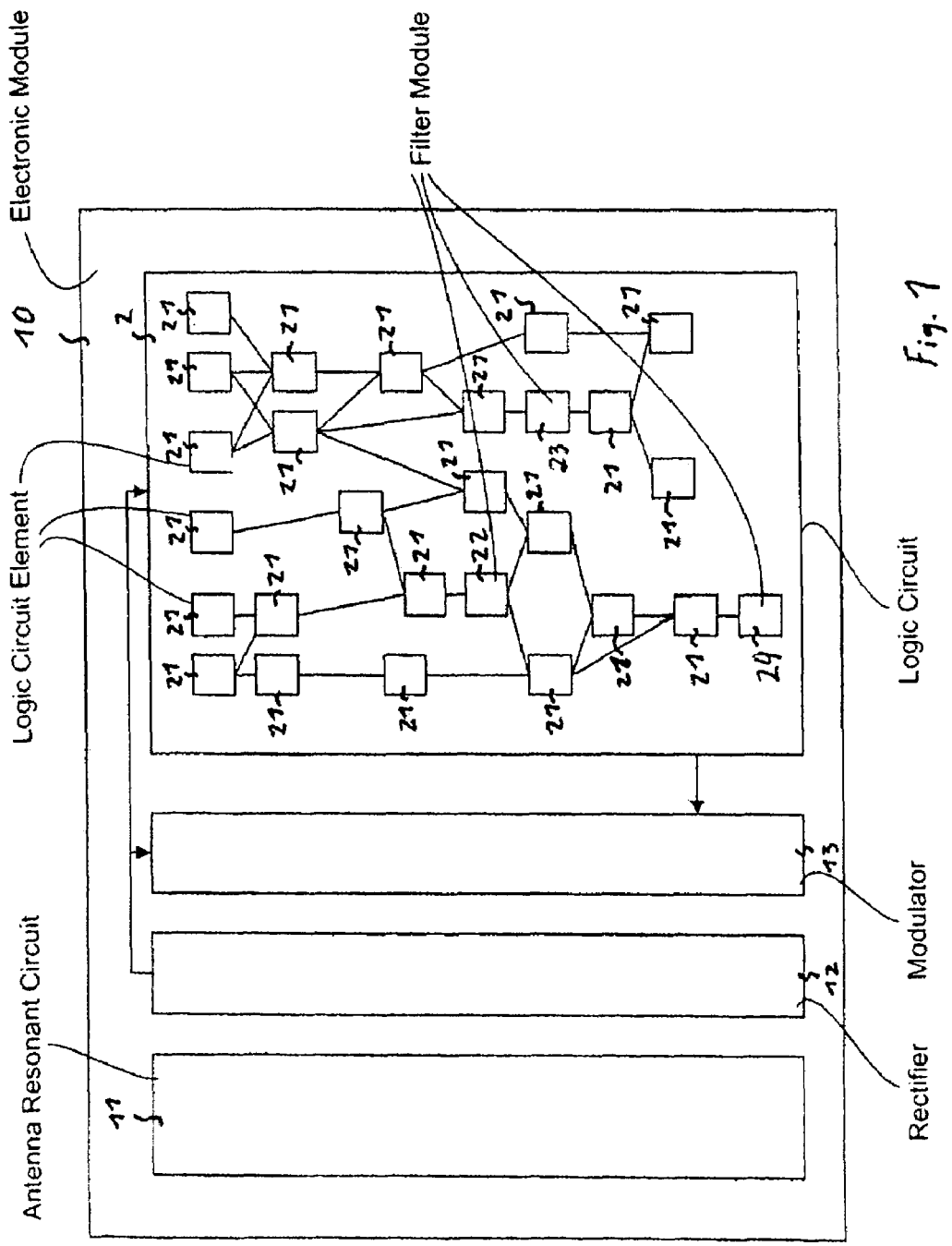
FIG. 1 shows a schematic diagram of an electronic module according to the invention.

The electronic module 10 is an RFID transponder having an antenna resonant circuit 11, a rectifier 12, a modulator 13 and a digital logic circuit 2. It is also possible, however, that the electronic module 10 shown in FIG. 1 is an electronic module that serves another purpose and has a digital logic circuit. The design of the electronic module 10 as a flexible, multilayer foil element in polymer semiconductor technology means that the electronic module 10 is particularly suitable for security applications and for mass applications. In addition to the functional groups shown in FIG. 1, it is particularly advantageous for such types of applications if the electronic module 10 also has a display element fabricated in organic technology, for example an LC display, which is controlled by the logic circuit 2.

The logic circuit 2 is composed of a plurality of logic circuit elements connected together. The individual logic circuit elements are logic gates, for example, such as NOR_gates, NAND-gates or inverters, or even more complex logic circuit elements such as shift registers, adders etc. The individual logic circuit elements of the logic circuit 2 are here preferably made up of organic field effect transistors as described in WO 03/081 671 A2, in order to achieve as high a switching speed as possible for the individual logic circuit elements.

FIG. 1 shows a section of the logic circuit 2 containing a plurality of logic circuit elements 21 and a plurality of filter modules 22, 23 and 24 connected together to produce a logic function. The connection of the logic circuit elements 21 shown in FIG. 1 is chosen purely arbitrarily simply in order to illustrate the invention, and the connection that is chosen must depend on the logic function to be achieved.

As shown in FIG. 1, the filter modules 22, 23 and 24 are connected between the logic circuit elements 21 of the logic circuit 2. The filter modules 22, 23 and 24 have an input that is connected to an output of one of the organic logic circuit elements 21, and an output that is either connected to an input of another of the logic circuit elements 21 or to an output of the logic circuit 2. The filter modules 22, 23 and 24 each filter out from the signal present at the input, spurious signals generated by different signal propagation times in the organic components of the preceding logic circuit elements, and provide a regenerated binary signal at the output.

Figure 2:
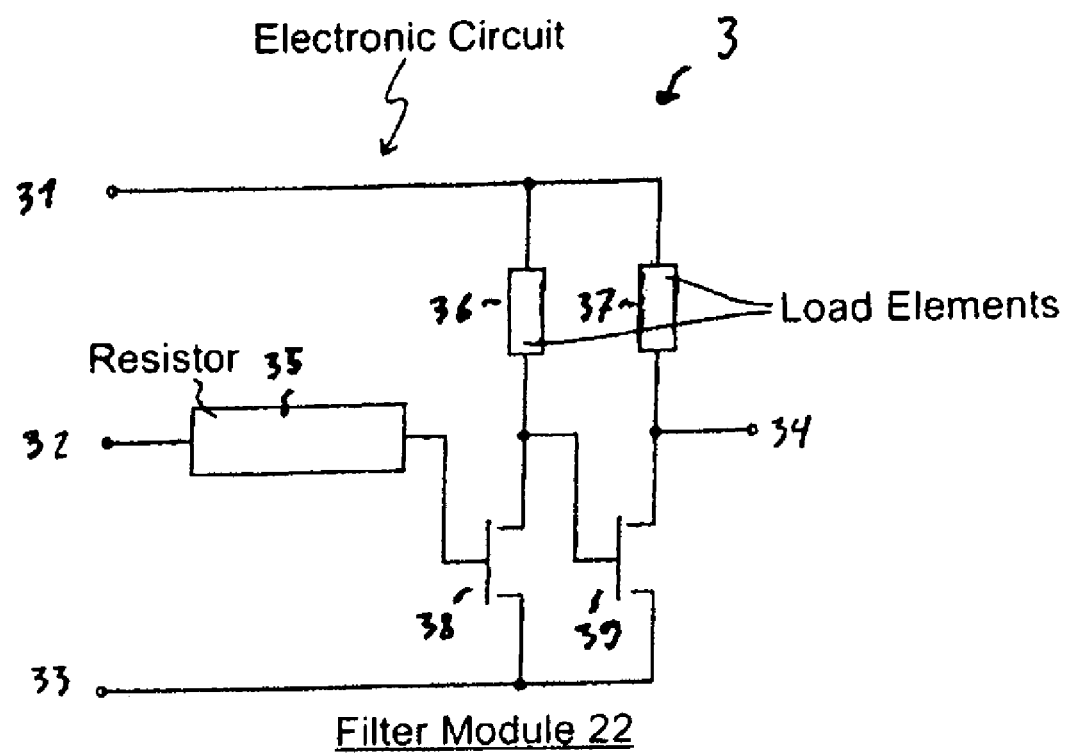
FIG. 2 shows a circuit diagram of a filter module for the electronic module shown in FIG. 1.

The filter module 22 comprises an electronic circuit 3, as shown in FIG. 2 for example. How the filter module 22 works is now explained below with reference to FIG. 3.

Figure 3:
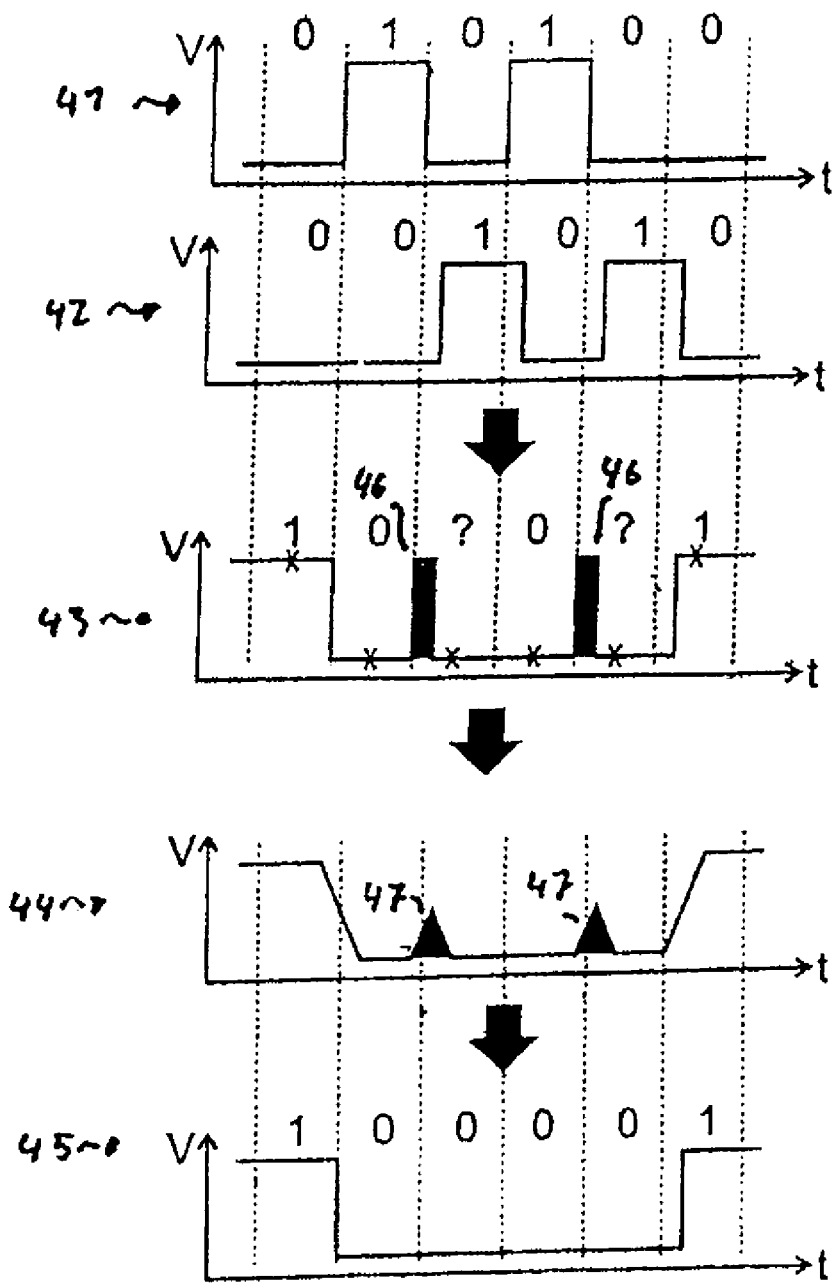
FIG. 3 shows a number of timing diagrams to illustrate the signal transfer in the electronic module shown in FIG. 1.

FIG. 3 shows a number of timing diagrams 41 to 45, each of which show the waveform of a signal level V at a point in the logic circuit 2, i.e. the signal level V is plotted against time t.

Timing diagrams 41 and 42 show the waveform of the input signals at the inputs of the logic circuit element preceding the filter module 22. The timing diagram 43 shows the waveform of the output signal at the output of this logic circuit element. The logic circuit element is a NOR-gate in this case by way of example.

The clock of the wanted signal at the respective point of the logic circuit 2 is indicated by dashed lines in the timing diagrams 41 to 45, where it should also be noted here that this clock may be different at the input and output of the logic circuit element and at the input and output of the filter module 22 because of the signal propagation times through the logic circuit element and through the filter module.

The switching response of the organic components in the logic circuit elements preceding the logic circuit element illustrated in the timing diagrams 41 to 43 produces in the input signals applied to this logic circuit element the time offset shown in the timing diagrams 41 and 42. If the two input signals are combined by the logic circuit element, then the output signal shown in timing diagram 43 is produced, which contains glitches 46. The signal distorted by the glitches 46 is now input to the filter module 22. The filter module 22 suppresses all spurious signals that are appreciably shorter than the clock period of the wanted signal and thereby obtains an output signal free from unwanted signals. The filter module 22 is composed of a low-pass filter, which attenuates clock pulses that are appreciably shorter than the clock period of the wanted signal, and a subsequent discretization amplifier circuit.

The filter module 22 thus consists of the circuit 3 shown in FIG. 2, for example, containing a resistor 35, two organic field effect transistors 38 and 39 and two organic load elements 36 and 37. The organic field effect transistors 38 and 39 and the organic load elements 36 and 37 form a discretization amplifier circuit. The organic load elements 36 and 37 may be the special organic field effect transistors described in WO 03/981 671 A2, which simulate a resistor. The resistor 35 is preferably an organic resistor. The circuit 3 also has a terminal 32 for the input signal, a terminal 34 for the output signal, a terminal 31 for the supply voltage and a ground terminal 33.

The resistor 35 is used with the input capacitance of the amplifier stage as an RC low-pass filter, which appreciably attenuates the glitches 46 of relatively short duration, but which only has a slight effect on the slower wanted signal. The RC low-pass filter is thus implemented by the resistor 35 in conjunction with the gate-source capacitance of the organic field effect transistor 38. The signal present at the output of the RC low-pass filter is shown in the timing diagram 44. The glitches 46 are attenuated to the glitches 47 by the RC low-pass filter. The subsequent amplifier stage not only restores the edge steepness of the wanted signal, which was degraded in the RC low-pass filter, but also removes the attenuated glitches 47 completely from the signal by discretization to two digital levels. The signal shown in timing diagram 45, from which the spurious noise has been removed, is then present at the output of the amplifier stage.

The cutoff frequency of the RC low-pass filter is preferably at least twice as high, preferably three to four times as high, as the clock frequency of the wanted signal.

Figure 4:
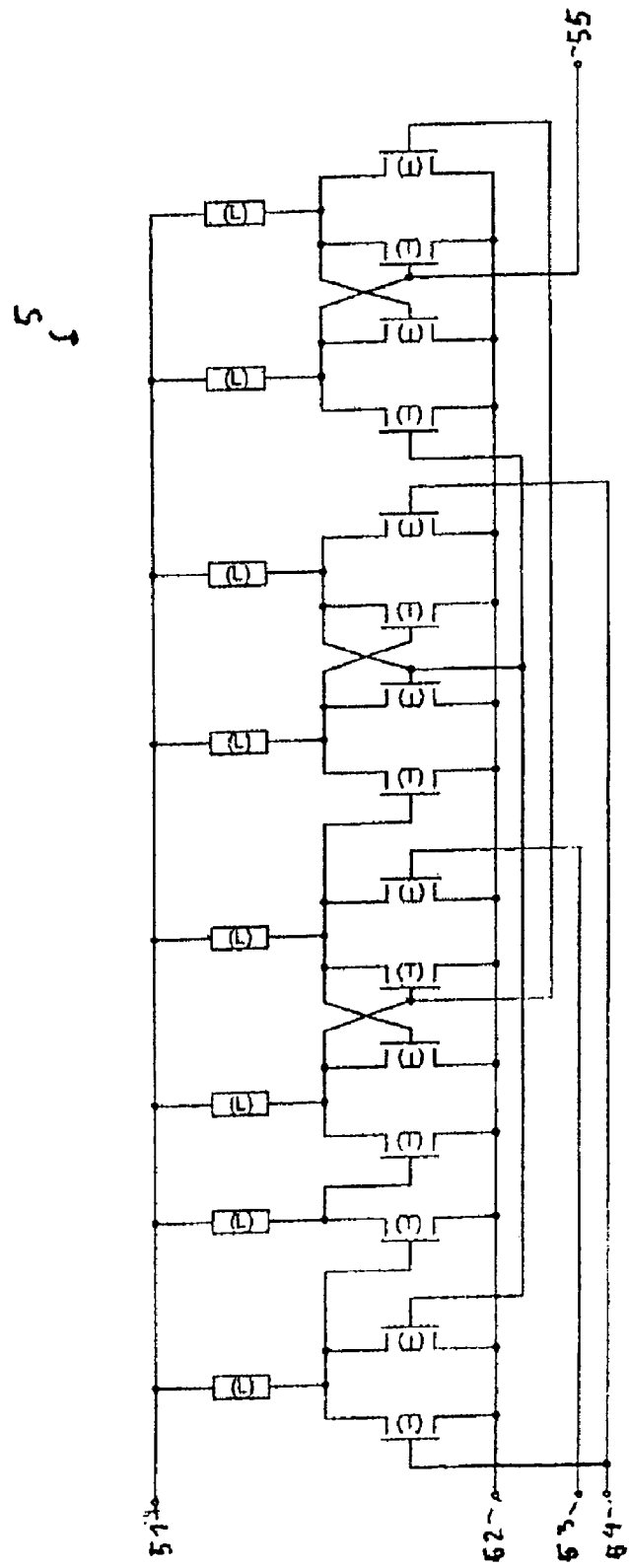
FIG. 4 shows a circuit diagram of a further embodiment of a filter module for the electronic module shown in FIG. 1.

The filter module 23 is formed from a circuit 5 shown in FIG. 4. Operation of the filter module 23 is now is explained below with reference to the timing diagrams shown in FIG. 5.

Figure 5:
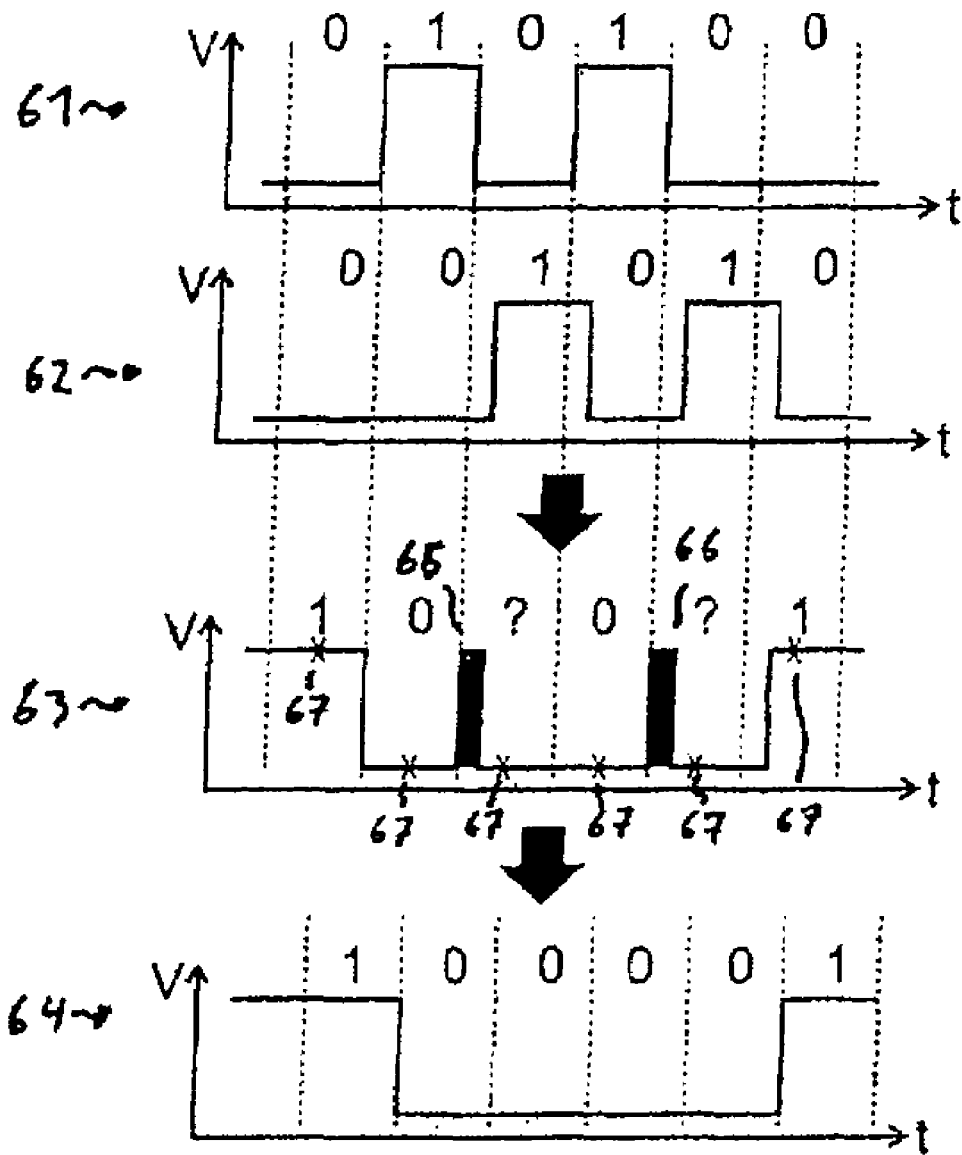
FIG. 5 shows a number of timing diagrams to illustrate the signal transfer in the electronic module shown in FIG. 1.

FIG. 5 shows a number of timing diagrams 61 to 64, which show the waveform of the signal level at different points in the logic circuit 2. The signal level V is plotted against time t in the timing diagrams 61 to 64. As in FIG. 3, the clock of the wanted signal is again indicated here by dashed lines.

The signal shown in timing diagram 63, which is distorted by glitches 66, is present at the input of the tilter module 23. The glitches 66 arise in this case as a result of the different signal propagation time in the organic components of the preceding logic circuit elements caused by the switching response of the organic components, as already explained above with reference to FIG. 3.

The filter module 23 now suppresses the glitches 66 and provides at the output the regenerated binary signal shown in timing diagram 64. To do this, the filter module 23 only transfers the level of the input signal to the output at specific times set by a separate clock signal. For the rest of the time, the filter module 23 retains the last previous level at the output. Thus the timing diagram 63 shows a plurality of time points 67, which are set by the separate clock signal and at which the input level is transferred to the output by the filter module 23.

By a suitable phase shift of the clock signal, for example by the 180° phase shift shown in the timing diagram 63, the situation is achieved in which there is no possibility of a spurious signal appearing at the input of the filter module 23 at the time of the transfer, and hence the filter module transfers the correct signal level. As shown in the timing diagram 63, the glitches 66 have already decayed away at the is time points 67, so that the correct signal level is present there. This signal level is then also retained by the filter module 23 for the rest of the clock period, so that the signal without noise spikes shown in timing diagram 64 is produced at the output The circuit 5 shown in FIG. 4 presents a possible implementation of the filter module 23 in organic semiconductor technology. The circuit 5 comprises a plurality of organic field effect transistors T and a plurality of organic load elements L connected together as shown in FIG. 4. The circuit 4 has a terminal 53 for the input signal, a terminal 54 for the external clock signal, a terminal 55 for the output signal, a terminal 51 for the supply voltage and a ground terminal 54.

The external clock signal is here extracted from the clock of the wanted signal by one or more series-connected delay elements. Inverters made up of organic components, for example, can be used as delay elements. In a preferred embodiment of the invention, the separate clock signal is generated from the clock signal that sets the processing timing of the logic circuit 2. The phase relationship between this clock signal and the clock of the wanted signal present at the input of the filter module 23, and the required phase shift of the separate clock signal with respect to the clock of the wanted signal must be determined. Then an appropriate number of delay elements are chained together to generate the required separate clock signal.

Another option for generating the separate clock signal is now illustrated with reference to the exemplary embodiment shown in FIG. 6.

Figure 6:
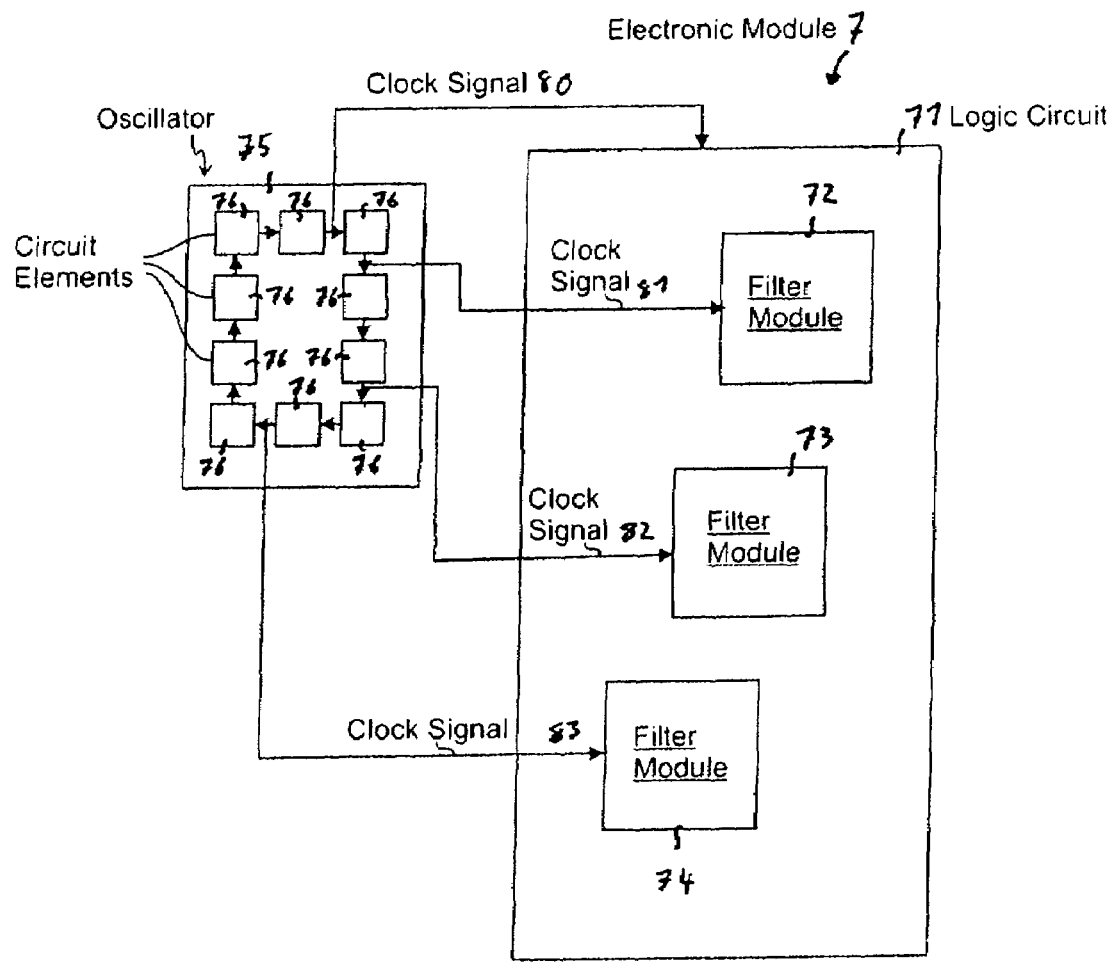
FIG. 6 shows a schematic diagram of a section of another electronic module according to the invention.

FIG. 6 shows an electronic module 7 comprising a logic circuit 71 and an oscillator 75.

The logic circuit 71 has the same composition as the logic circuit 2 of FIG. 1, and has a multiplicity of logic circuit elements connected together. In addition, a plurality of filter modules are provided, which have the same design as the filter module 23 of FIG. 1. Of these filter modules, three filter modules 72, 73 and 74 are shown in FIG. 6. The oscillator 75 provides a plurality of clock signals 80, 81, 82 and 83. The clock signal 80 constitutes the clock signal of the logic circuit 71 and sets the data processing speed of the logic circuit 71. The clock signals 81 to 83 are supplied to the filter modules 72 to 74 as separate clock signals.

The oscillator 75 comprises a multiplicity of organic circuit elements 76 chained together in a ring. The organic circuit elements are inverters, for example, made up of organic field effect transistors As shown in FIG. 6, the clock signals 80 to 83 are picked off at the outputs of different organic circuit elements 76, so that the clock signals 80 to 83 are mutually phase-shifted.

As already explained above, the phase shift of the respective separate clock signal with respect to the clock signal 80 is determined, and then that member of the organic circuit elements 76 is determined whose output signal has the required phase shift compared with the signal present at the clock-signal pick-off point.

The invention claimed is:

1. An electronic module having two or more organic logic circuit elements interconnected to form a logic circuit, said organic logic circuit elements each comprising organic components, the electronic module comprising:
   a logic circuit comprising at least one filter module, which has an input connected to one of the organic logic circuit elements, and an output, and is arranged to filter out from a signal present at the logic circuit input spurious signals generated by different signal propagation times in the organic components of the logic circuit elements, and to regenerate a binary signal at the output; and
   the filter module comprises a plurality of organic components, which are interconnected so that the filter module transfers the level of the signal present at the logic circuit input to the logic circuit output at specific points in time set by a separate clock signal and for the rest of the time of said input signal retains the last previous level of a signal at the output , where the separate clock signal is phase-shifted with respect to a clock of the signal present at the logic circuit input.

2. The electronic module as claimed in claim 1 wherein the separate clock signal is phase-shifted with respect to the clock of the signal present at the logic circuit input at and between 90° and 270°.

3. The electronic module as claimed in claim 1 wherein the phase shift is selected so that glitches produced by different signal propagation times in the organic components of a preceding logic circuit elements lie at least 0.2 period lengths away from the time of the transfer.

4. The electronic module as claimed in claim 1 wherein the electronic module comprises a ring oscillator comprising field effect transistors, which oscillator provides the separate clock signal for the filter module.

5. The electronic module as claimed in claim 4 wherein the ring oscillator provides the separate clock signal for two or more filter modules.

6. The electronic module as claimed in claim 4 wherein the ring oscillator provides a clock signal for the logic circuit.

7. The electronic module gas claimed in claim 6 wherein the ring oscillator comprises a plurality of organic circuit elements chained together in a ring one after another, the clock signal for the logic circuit being taken from the output of a first circuit element of the circuit elements, and that the separate clock signal for the filter module is taken from the output of a second circuit element after the first circuit element.

8. The electronic module as claimed in claim 7 wherein the second circuit element at whose output the separate clock signal is taken, is determined from the number of logic circuit elements preceding the filter module.

9. The electronic module as claimed in claim 1 wherein the input clock signal of the logic circuit is supplied to one or more series-connected delay elements each having an output, which elements are connected at their output to the filter module, and which supply a delayed input clock signal to the filter module as the separate clock signal.

10. The electronic module as claimed in claim 1 wherein the filter module is connected to the output of a logic circuit element that combines by a logic operation a plurality of binary input signals generated via different branches of the logic circuit to produce an output signal.

11. The electronic module as claimed in claim 1 wherein both the input and the output of the filter module are connected to an organic logic circuit element.

12. The electronic module as claimed in claim 1 wherein the output of the filter module is connected to an output of the logic circuit.

13. The electronic module as claimed in claim 1 wherein the logic circuit comprises two or more filter modules.

14. The electronic module as claimed in claim 1 wherein the electronic module is an RFID transponder.

15. The electronic module as claimed in claim 1 wherein the logic circuit comprises a flexible foil element and includes a circuit arranged to operate as a security element.

* * * * *